(12) United States Patent
Kamiya

(10) Patent No.: US 10,545,063 B2
(45) Date of Patent: Jan. 28, 2020

(54) FORCE DETECTION SENSOR HAVING A BASE MEMBER WITH A FORCE RECEIVING SURFACE AND ANOTHER SURFACE WITH AN INTERDIGITAL ELECTRODE

(71) Applicant: Seiko Epson Corporation, Tokyo (JP)

(72) Inventor: Toshiyuki Kamiya, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/786,991

(22) Filed: Oct. 18, 2017

(65) Prior Publication Data

US 2018/0120181 A1 May 3, 2018

(30) Foreign Application Priority Data

Oct. 28, 2016 (JP) ................................ 2016-211178

(51) Int. Cl.
*G01L 1/16* (2006.01)
*G01L 5/22* (2006.01)
(Continued)

(52) U.S. Cl.
CPC ............... *G01L 5/167* (2013.01); *G01L 1/16* (2013.01); *G01L 1/165* (2013.01); *H01L 41/1132* (2013.01); *H01L 41/18* (2013.01)

(58) Field of Classification Search
CPC .... G01G 19/4142; G01G 19/12; G01G 19/52; G01G 23/02; G01G 23/06; G01G 3/00; B60R 21/01516; B60N 2/7094; B60N 2/002; B60N 2/90; B60N 2/44; G01L 1/205; H01H 13/78; H01H 2201/038; H01H 2205/016; H01H 2225/018; H01H 2203/038; H01H 13/807; H01H 2215/004;
(Continued)

(56) References Cited

U.S. PATENT DOCUMENTS 4,623,813 A * 11/1986 Naito ................. G01G 3/13
177/210 FP
9,347,838 B2 * 5/2016 Chen ................. G01L 1/142
(Continued)

FOREIGN PATENT DOCUMENTS

JP    60-133320 A    7/1985
JP    05-322670 A    12/1993
(Continued)

OTHER PUBLICATIONS

Extended European Search Report for Application No. EP 17 19 8875 dated Mar. 21, 2018 (8 pages).

*Primary Examiner* — Brandi N Hopkins
(74) *Attorney, Agent, or Firm* — Harness, Dickey & Pierce, P.L.C.

(57) ABSTRACT

A force detection sensor includes a base member having a first surface subjected to an external force and a second surface having a normal direction different from the first surface, and an inter-digital electrode placed on the second surface. Further, the second surface deforms when the first surface is subjected to the force. Furthermore, the second surface includes a part formed by a surface of a piezoelectric material and the inter-digital electrode is placed in the part. The piezoelectric material is quartz crystal. The second surface is parallel to an electrical axis of the quartz crystal.

10 Claims, 8 Drawing Sheets

(51) Int. Cl.
*H01L 41/113* (2006.01)
*H01L 41/18* (2006.01)

(58) Field of Classification Search
CPC ........... H01H 2225/03; H03K 17/9625; H01C 10/10; H04M 1/23
See application file for complete search history.

(56) References Cited

U.S. PATENT DOCUMENTS

| | | | |
|---|---|---|---|
| 2009/0115010 A1* | 5/2009 | Fink | G01L 1/165 257/416 |
| 2012/0204656 A1* | 8/2012 | Suzuki | G01L 1/162 73/862.59 |
| 2012/0260745 A1* | 10/2012 | Tsuchiya | B25J 13/085 73/862.59 |
| 2013/0152700 A1 | 6/2013 | Kamiya et al. | |
| 2013/0233089 A1* | 9/2013 | Kawai | B25J 13/085 73/862.68 |
| 2014/0053660 A1* | 2/2014 | Kamiya | G01L 1/16 73/862.68 |
| 2014/0236354 A1 | 8/2014 | Kamiya et al. | |
| 2014/0366646 A1* | 12/2014 | Matsuzawa | G01L 1/16 73/862.68 |
| 2015/0013461 A1* | 1/2015 | Pollard | H01L 41/1132 73/579 |
| 2015/0120051 A1* | 4/2015 | Matsuzawa | H01L 41/1132 700/258 |
| 2015/0120052 A1* | 4/2015 | Mizushima | G01L 1/16 700/258 |
| 2018/0252604 A1* | 9/2018 | Kawai | G01L 5/167 |

FOREIGN PATENT DOCUMENTS

| | | |
|---|---|---|
| JP | 2002-031574 A | 1/2002 |
| JP | 2005-184340 A | 7/2005 |
| JP | 2007-093213 A | 4/2007 |
| JP | 2010-139506 A | 6/2010 |
| JP | 2010-160101 A | 7/2010 |
| JP | 2010-190782 A | 9/2010 |
| JP | 2012-008122 A | 1/2012 |
| JP | 2013-130431 A | 7/2013 |
| JP | 2014-163870 A | 9/2014 |

* cited by examiner

FORCE DETECTION SENSOR HAVING A BASE MEMBER WITH A FORCE RECEIVING SURFACE AND ANOTHER SURFACE WITH AN INTERDIGITAL ELECTRODE

BACKGROUND

1. Technical Field

The present invention relates to a force detection sensor, a force sensor, and a robot.

2. Related Art

For example, as a force detection sensor, a configuration using vibrators is known (e.g. Patent Document 1 (JP-A-2002-31574)). The force detection sensor described in Patent Document 1 has a substrate and a first vibrator and a second vibrator stacked on the substrate. When the first vibrator is vibrated and the second vibrator is pressed by an object, the vibration of the first vibrator is easily transmitted to the second vibrator by the amount of pressing and a signal having the same frequency as the first vibrator is output from the second vibrator with an amplitude according to the pressing force.

However, in the force detection sensor, a minor change in amplitude according to a minor change in pressing force is hard to appear in the signal output from the second vibrator, and it is difficult to exert a high force detection property.

SUMMARY

An advantage of some aspects of the invention is to provide a force detection sensor having a higher force detection property, a force sensor, and a robot.

The advantage can be achieved by the following configurations.

A force detection sensor according to an aspect of the invention includes a base member having a first surface subjected to an external force and a second surface having a normal direction different from the first surface, and an inter-digital electrode placed on the second surface.

With this configuration, when the first surface is subjected to a force, the pitch of electrode fingers of the inter-digital electrode changes. When the pitch of the electrode fingers changes, the frequency of surface acoustic wave excited in the surface of the base member (the resonance frequency of an SAW resonator) by energization of the inter-digital electrode also changes. Accordingly, the applied force may be detected based on the frequency change. In the above described manner, the applied force is detected based on the frequency change, and thereby, the force detection sensor that may detect even a small force (minor force change) with higher accuracy and exert a higher force detection property is obtained.

In the force detection sensor according to the aspect of the invention, it is preferable that the second surface deforms when the first surface is subjected to the force.

With this configuration, the pitch of the electrode fingers of the inter-digital electrode changes according to the magnitude of the applied force more reliably.

In the force detection sensor according to the aspect of the invention, it is preferable that the second surface includes a surface of a piezoelectric material.

With this configuration, when the inter-digital electrode is energized, surface acoustic wave may be excited in the surface of the base member more reliably.

In the force detection sensor according to the aspect of the invention, it is preferable that a constituent material of the piezoelectric material is quartz crystal.

With this configuration, excellent temperature characteristics and excellent mechanical strength may be exerted.

In the force detection sensor according to the aspect of the invention, it is preferable that the first surface crosses an electrical axis of the quartz crystal.

With this configuration, surface acoustic wave may be excited in the surface of the base member more reliably.

In the force detection sensor according to the aspect of the invention, it is preferable that the base member has a first base member and a second base member connected to the first base member, the first base member has the first surface, and the second base member has the second surface.

With this configuration, the degree of freedom of design of the base member increases.

In the force detection sensor according to the aspect of the invention, it is preferable that the base member is pressurized.

With this configuration, responsiveness is improved.

A force sensor according to an aspect of the invention includes the force detection sensor according to the aspect of the invention.

With this configuration, a force sensor with higher reliability is obtained.

A robot according to an aspect of the invention includes the force detection sensor according to the aspect of the invention.

With this configuration, a robot with higher reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a force detection sensor, a force sensor, and a robot according to the invention will be explained in detail based on preferred embodiments shown in the accompanying drawings.

First Embodiment

Figure 1:
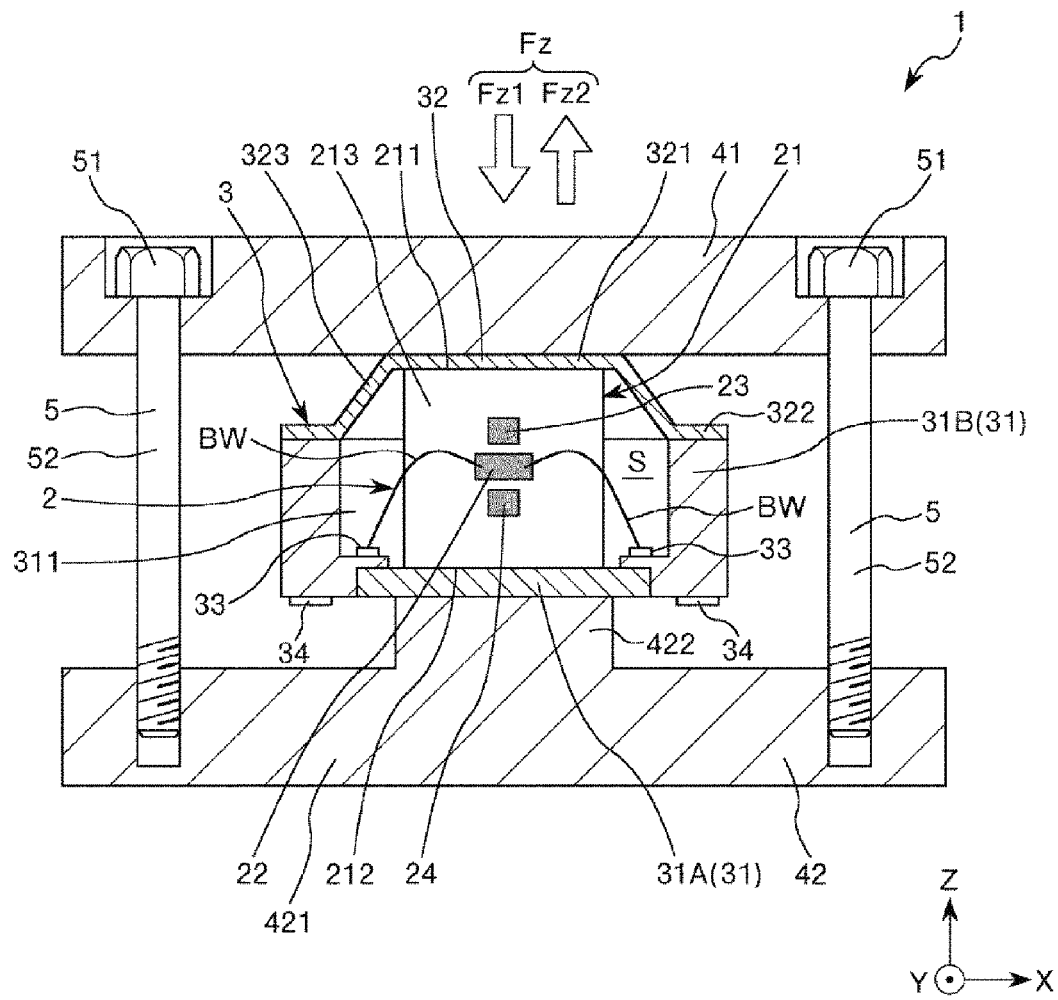
FIG. 1 is a sectional view showing a force sensor according to a first embodiment of the invention.
Figure 2:
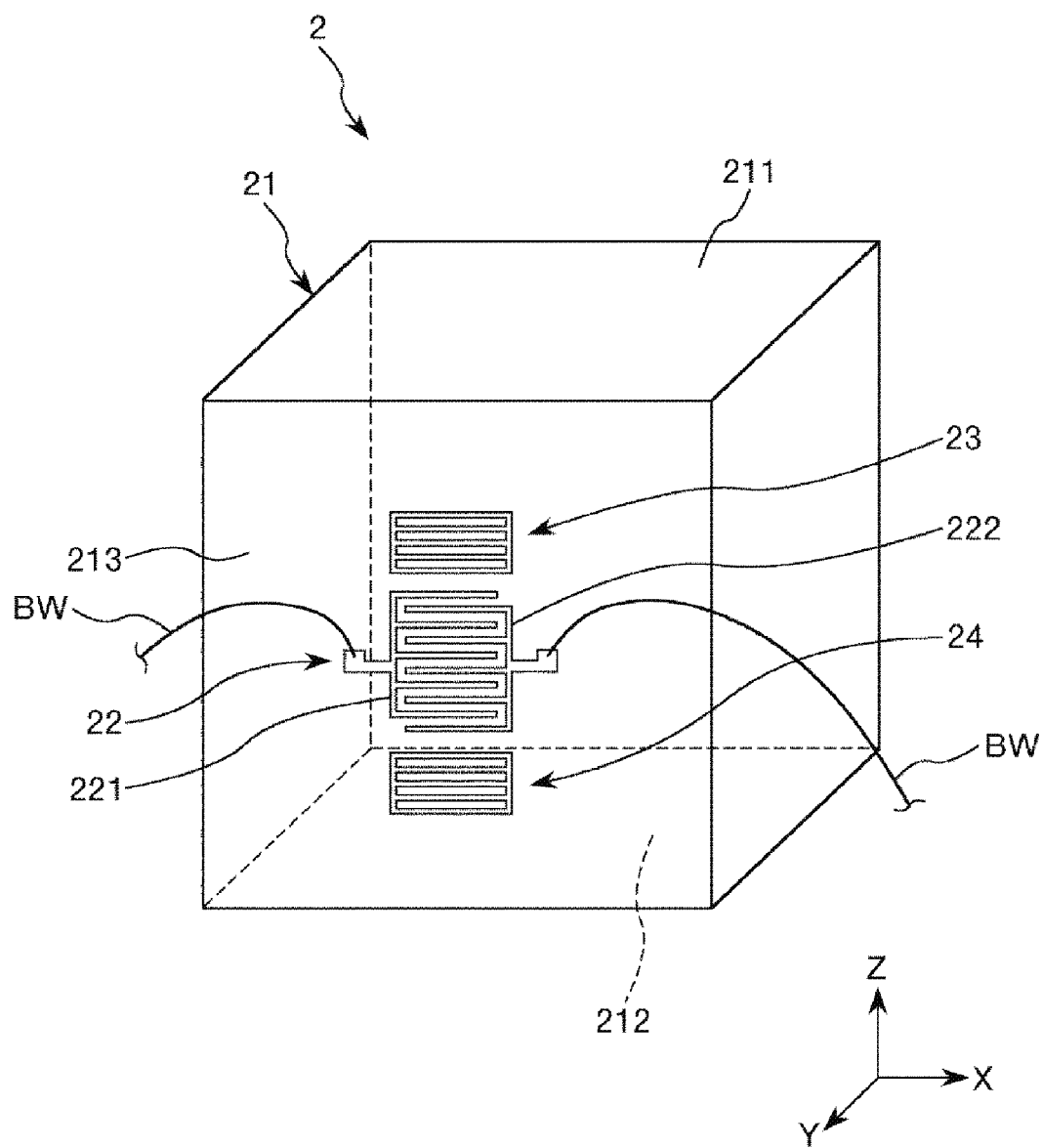
FIG. 2 is a perspective view of a force detection sensor of the force sensor shown in FIG. 1.
Figure 3:
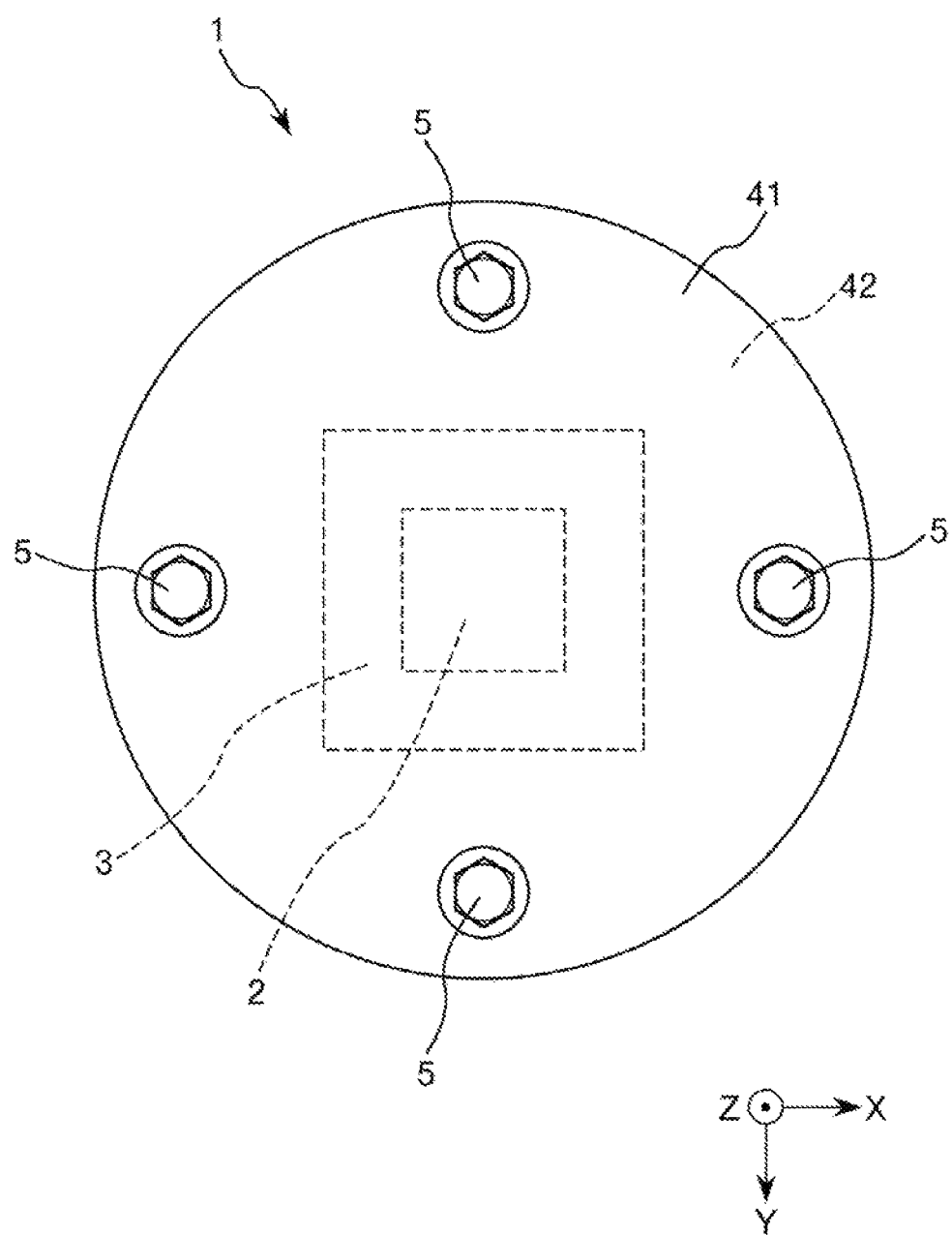
FIG. 3 is a plan view of the force sensor shown in FIG. 1.

FIG. 1 is a sectional view showing a force sensor according to a first embodiment of the invention. FIG. 2 is a perspective view of a force detection sensor of the force sensor shown in FIG. 1. FIG. 3 is a plan view of the force sensor shown in FIG. 1. Hereinafter, for convenience of explanation, the upside in FIGS. 1 and 2 and the near side of the paper in FIG. 3 are also referred to as "upper" and the downside in FIGS. 1 and 2 and the far side of the paper in FIG. 3 are also referred to as "lower". Further, as shown in the respective drawings, hereinafter, three axes orthogonal to one another are referred to as "X-axis", "Y-axis", and "Z-axis", and directions parallel to the X-axis are also referred to as "X-axis directions", directions parallel to the Y-axis are also referred to as "Y-axis directions", and directions parallel to the Z-axis are also referred to as "Z-axis directions".

A force sensor 1 shown in FIG. 1 may detect a force Fz (compression force Fz1, tensile force Fz2) in the Z-axis directions as an external force. The force sensor 1 has a force detection sensor 2, a package 3 housing the force detection sensor 2, a pair of substrates 41, 42 provided to sandwich the package 3 in the thickness direction, and pressurization bolts 5 that couple the substrates 41, 42 and pressurize the force detection sensor 2 via the package 3. These sections will be explained below in sequence.

Force Detection Sensor Element

As shown in FIGS. 1 and 2, the force detection sensor 2 has a base member 21 including a pressure receiving surface 211 as a first surface subjected to an external force and a placement surface 213 as a second surface having a different normal direction from the pressure receiving surface 211, and an inter-digital electrode 22 placed on the placement surface 213. The inter-digital electrode 22 is also the comb-like electrode. Note that "different" has a concept except the same plane and refers to a difference in normal direction from each other, preferably, placement with a predetermined angle (particularly, 90°).

The force detection sensor 2 forms an SAW resonator that may excite surface acoustic wave in the surface of the base member 21. When the compression force Fz1 is applied, the base member 21 compressively deforms in the Z-axis direction and, when the tensile force Fz2 is applied, the base member 21 tensilely deforms in the Z-axis direction. Then, the pitch of the inter-digital electrode 22 (intervals between electrode fingers) changes with the deformation of the base member 21. When the pitch of the inter-digital electrode 22 changes, the frequency f of the surface acoustic wave excited in the surface of the base member 21 (the resonance frequency of the SAW resonator) changes. This is because the frequency f depends on the pitch of the inter-digital electrode 22. Accordingly, the force detection sensor 2 may detect the force Fz based on the frequency f. The frequency f can be detected stably with high resolution, and thereby, the absolute value of the force Fz and the change thereof can be detected with high accuracy. As below, the force detection sensor 2 will be explained in detail.

As shown in FIG. 2, the force detection sensor 2 has the base member 21, the inter-digital electrode 22 provided in the base member 21, and a pair of reflectors 23, 24 provided with the inter-digital electrode 22 in between on the placement surface 213.

The base member 21 is a quadrangular prism (cubic in the embodiment). Further, the base member 21 has a top surface and a bottom surface, and four side surfaces connecting the top surface and the bottom surface. Of the surfaces, the top surface of the base member 21 is formed by an XY-plane with a normal along the Z-axis and forms the pressure receiving surface 211 as the first surface subjected to the force Fz. Further, one of the four side surfaces is formed by an XZ-plane with a normal along the Y-axis and forms the placement surface 213 as the second surface on which the inter-digital electrode 22 and the reflectors 23, 24 are placed.

The placement surface 213 deforms when the pressure receiving surface 211 is subjected to the force Fz. As described above, the placement surface 213 deforms, and thereby, the pitch of the inter-digital electrode 22 may be changed and the frequency f of the above described surface acoustic wave may be changed more reliably. Note that "deformation" here has a broad concept including e.g. the case of not substantial deformation, but with internal distortion (the same applies to the following description).

Particularly, in the embodiment, the surface adjacent to (i.e., the surface connected to without a different surface in between) the pressure receiving surface 211 is used as the placement surface 213. Accordingly, the force Fz applied to the pressure receiving surface 211 is easily transmitted to the placement surface 213. Therefore, the placement surface 213 maybe deformed more effectively and more largely. Accordingly, the amount of change of the frequency f with respect to the magnitude of the applied force Fz may be made larger. As a result, resolution of the force detection sensor 2 is further improved.

Note that the shape of the base member 21 is not particularly limited as long as the base has the pressure receiving surface 211 (first surface) and the placement surface 213 (second surface) on which the inter-digital electrode 22 is provided, but may be e.g. a polygonal prism such as a triangular prism, pentagonal prism, hexagonal prism or the like. Further, the respective surfaces of the base member 21 including the pressure receiving surface 211 and the placement surface 213 are not limited to flat surfaces but entire or part of the surfaces may be curved surfaces.

The base member 21 is formed by a piezoelectric material. Accordingly, the placement surface 213 includes a surface of the piezoelectric material. Thereby, the surface acoustic wave maybe excited in the surface (placement surface 213) of the base member 21 more reliably. Note that the constituent material of the piezoelectric material is not particularly limited, but includes e.g. quartz crystal, lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), potassium sodium niobate ($(K,Na)NbO_3$), bismuth ferrite ($BiFeO_3$), sodium niobate ($NaNbO_3$), bismuth titanate ($Bi_4Ti_3O_{12}$), and sodium bismuth titanate ($Na_{0.5}Bi_{0.5}TiO_3$).

Particularly, in the embodiment, the constituent material of the piezoelectric material is quartz crystal. That is, the base member 21 is formed of quartz crystal. Thereby, the force detection sensor 2 may exert higher frequency stability, better temperature characteristics, higher mechanical strength (rigidity, load bearing), higher natural frequency, and higher dynamic range compared to the case using another piezoelectric material. Accordingly, the force Fz maybe detected in a wider range with higher accuracy. Therefore, the force detection sensor 2 having an excellent detection property is obtained.

The pressure receiving surface 211 crosses the electrical axis of the quartz crystal of the piezoelectric material. Specifically, in the embodiment, the pressure receiving surface 211 is orthogonal to the electrical axis of the quartz crystal. That is, the pressure receiving surface 211 is the X-cut face of the quartz crystal. The placement surface 213 is parallel to the electrical axis of the quartz crystal. The quartz crystal with the cut angle is used, and thereby, surface acoustic wave may be excited more reliably. The cut angle of the quartz crystal forming the base member 21 includes e.g. ST cut, CT cut, AT cut, and BT cut, and the ST cut is preferably used. The cut angle is used, and thereby, surface acoustic wave called Rayleigh wave may be used and, for example, compared to surface acoustic wave called leaky wave, variations in frequency and frequency-temperature characteristics for the processing accuracy of the base member 21 and the inter-digital electrode 22 may be made extremely small. Accordingly, mass productivity is excellent. However, the cut angle of the quartz crystal is not particularly limited as long as surface acoustic wave may be excited.

The inter-digital electrode 22 is provided in the center part in the Z-axis direction of the placement surface 213 of the base member 21. Further, the inter-digital electrode 22 has a pair of electrodes 221, 222. The pair of electrodes 221, 222 are placed so that their electrode fingers may mesh with each other. That is, the electrodes 221, 222 are placed so that their electrode fingers may be alternately arranged without contact with each other along the Z-axis direction. When a drive voltage is applied between the electrodes 221, 222, cyclical strain is generated between the electrode fingers due to the piezoelectric effect, and surface acoustic wave is excited along the Z-axis direction (the arrangement direction of the electrode fingers). As a result, a voltage change with the resonance frequency of the SAW resonator is output between the pair of electrodes 221, 222. Note that, in the embodiment, the extension direction of the electrode fingers and the arrangement direction of the electrode fingers are orthogonal, however, the directions are not necessarily orthogonal as long as surface acoustic wave may be excited.

The pair of reflectors 23, 24 are placed on both sides with the inter-digital electrode 22 in between. The reflectors 23, 24 have a function of reflecting the surface acoustic wave propagating in the base member 21 and containing the surface acoustic wave between the reflector 23 and the reflector 24. Note that the reflectors 23, 24 may be omitted.

The inter-digital electrode 22 and the reflectors 23, 24 maybe respectively formed using metal materials having better conductivity including aluminum (Al) and aluminum alloys. The aluminum (Al) and the aluminum alloys are materials having smaller specific gravity than other metal materials such as copper (Cu) or tungsten (W), for example, and thus, the influence by the dimension variations of the inter-digital electrode 22 and the reflectors 23, 24 on the frequency-temperature characteristics of the force detection sensor 2 may be suppressed to be smaller.

As above, the force detection sensor 2 is explained. Note that, in the embodiment, the force detection sensor 2 is the so-called single-port SAW resonator with the single inter-digital electrode 22, however, not limited to that. The so-called dual-port SAW resonator with the two inter-digital electrodes 22 provided along the propagation direction of surface acoustic wave may be used. Or, another configuration may be employed.

Package

As shown in FIG. 1, the package 3 includes a base 31 having a concave portion 311 opening upward and a cap-shaped lid 32 joined to the upper surface of the base 31 to cover the opening of the concave portion 311. Further, an air-tight housing space S is formed inside of the package 3, and the force detection sensor 2 is housed in the housing space S. The atmosphere in the housing space S is not particularly limited, but the space is preferably filled with e.g. a rare gas such as nitrogen, argon, or helium. Thereby, the atmosphere in the housing space S is stable. Further, corrosion of the inter-digital electrode 22 and the reflectors 23, 24 or the like may be suppressed. The housing space S may be depressurized (preferably, in vacuum). Thereby, for example, the viscosity resistance is reduced and the Q-value of the force detection sensor 2 becomes higher, and surface acoustic wave is easily excited.

A lower surface 212 of the base member 21 is joined to the concave portion 311 (an upper surface of a foundation 31A), and the upper surface of the base member 21 (pressure receiving surface 211) is joined to the lid 32. The base 31 and lid 32 and the force detection sensor 2 are joined using e.g. an insulating adhesive. Note that the joining method of the base 31 and lid 32 and the force detection sensor 2 is not particularly limited. The force detection sensor 2 and the package 3 are not necessarily joined as long as the force detection sensor 2 may be fixed within the housing space S, for example.

As shown in FIG. 1, the lid 32 has a center portion 321 located in the center part and joined to the force detection sensor 2, an outer edge portion 322 located in the outer edge part and joined to the base 31, and a tapered connecting portion 323 located between the center portion 321 and the outer edge portion 322 and connecting the portions. The center portion 321 is located on the upside (substrate 41 side) of the outer edge portion 322. Only the center portion 321 is in contact with the substrate 41, and the outer edge portion 322 and the connecting portion 323 are not in contact with (separated from) the substrate 41. Thereby, the force Fz may be transmitted to the pressure receiving surface 211 more reliably and efficiently.

Note that, in the state in which the package 3 is not pressurized by the pressurization bolts 5, the force detection sensor 2 may be pressurized in the Z-axis direction by the package 3 or not. It is preferable that the sensor is not substantially pressurized. Thereby, for example, compared to the case where the sensor is pressurized by the package 3, the rigidity of the package 3 may be lower and the package 3 may be downsized. In the embodiment, the height of the housing space S and the height of the force detection sensor 2 are nearly equal, and, in the state in which the sensor is housed in the package 3, the force detection sensor 2 is not substantially pressurized by the package 3.

As shown in FIG. 1, in the embodiment, the base 31 has the foundation 31A forming the bottom center part of the base 31 and a frame portion 31B provided around the foundation 31A and forming the outer edge portion and the side wall of the bottom part of the base 31. The force detection sensor 2 is mounted on the upper surface of the foundation 31A. That is, the foundation 31A may function as a mount on which the force detection sensor 2 is mounted.

In the frame portion 31B, two internal terminals 33 located within the housing space S and two external terminals 34 located on the lower surface of the base 31 and electrically connected to the internal terminals 33 by internal wiring (not shown) are provided. The internal terminals 33, 33 are electrically connected to the electrodes 221, 222 of the inter-digital electrode 22 via bonding wires BW. According to the configuration, the inter-digital electrode 22 may be electrically led to the outside of the package 3, and electrical connection to an external apparatus may be made more easily.

The constituent material of the frame portion 31B is not particularly limited, but e.g. various ceramics such as aluminum oxide may be used. The constituent materials of the foundation 31A and the lid 32 are respectively not particularly limited, but e.g. members having coefficients of linear expansion close to that of the constituent material of the frame portion 31B may be preferably used. For example, in the case where the constituent material of the frame portion 31B is the above described ceramics, it is preferable that the constituent materials of the foundation 31A and the lid 32 are metal materials (e.g. alloys including kovar). Thereby, generation of thermal stress is harder in the package 3 and application of unnecessary stress (pressurization, other external forces than the force Fz) to the force detection sensor 2 may be reduced. Accordingly, the force sensor 1 with higher force detection accuracy is obtained.

As described above, the foundation 31A and the lid 32 are respectively formed using the metal materials, and thereby, strength and dimension accuracy of the foundation 31A and the lid 32 may be higher, and sufficient mechanical strength may be exerted and the height of the housing space S may be controlled with higher accuracy. Accordingly, the package 3 may be harder to break and the force detection sensor 2 may be preferably housed in the housing space S. On the other hand, the frame portion 31B is formed using the ceramics, and thereby, the strength of the frame portion 31B may be made higher and the whole strength of the package 3 may be increased. Further, the frame portion 31B may be insulated and formation of the internal terminals 33 and the external terminals 34 may be easier.

Substrates

As shown in FIG. 1, the pair of substrates 41, 42 are provided to overlap in the Z-axis direction with the package 3 in between. The package 3 is located in the center parts of the substrates 41, 42 in a plan view as seen from the Z-axis direction.

The substrate 41 is located on the upside of the package 3 and has a plate-like shape. The lower surface of the substrate 41 is in contact with the center portion 321 of the lid 32. On the other hand, the substrate 42 is located on the downside of the package 3 and has a plate-like base 421 and a projecting portion 422 projecting from the upper surface of the base 421. The upper surface of the projecting portion 422 is in contact with the lower surface of the base 31. Further, the projecting portion 422 is in contact with the lower surface of the foundation 31A of the base 31, but not in contact with the frame portion 31B. Thereby, the force Fz may be transmitted to the force detection sensor 2 more reliably and efficiently. Accordingly, the force sensor 1 with higher force detection accuracy is obtained. Further, air gaps are formed between the substrate 42 and the external terminals 34, and connection between the external terminals 34 and an external apparatus is easier.

The constituent materials of the substrates 41, 42 are not particularly limited, but e.g. various metals including iron, nickel, cobalt, gold, platinum, silver, copper, manganese, aluminum, magnesium, zinc, lead, tin, titanium, tungsten, alloys or intermetallic compounds containing at least one kind of the metals, or oxides, nitrides, carbides, etc. of the metals.

Pressurization Bolts

As shown in FIGS. 1 and 3, the substrates 41, 42 are secured (coupled) using the four pressurization bolts 5. The four pressurization bolts 5 are provided at equal intervals (i.e., intervals of 90 degrees) in the outer edge parts of the substrates 41, 42 along the circumferential direction. Further, the respective pressurization bolts 5 are placed so that head portions 51 thereof may be on the substrate 41 side and thread portions 52 of the respective pressurization bolts 5 are screwed into the substrate 42. By the respective pressurization bolts 5, pressure along the normal direction of the pressure receiving surface 211 is applied to the force detection sensor 2 within the package 3. That is, the base member 21 is pressurized. As described above, the base member 21 is pressurized, and thereby, for example, compared to the case without pressurization, responsiveness of the force sensor 1 is improved. Further, not only the compression force Fz1 but also the tensile force Fz2 may be detected more accurately.

According to the pressurization bolts 5, the magnitude of pressurization may be adjusted by the amount of tightening of the pressurization bolts 5. Accordingly, adjustment of pressurization is easier. The magnitude of pressurization is not particularly limited, but may be appropriately set according to the strength of the force detection sensor 2 or the like. Note that the number and arrangement of the pressurization bolts 5 are not particularly limited as long as the bolts may pressurize the force detection sensor 2. Or, the method is not limited to the method using the pressurization bolts 5 as long as the base member 21 may be pressurized.

As above, the configuration of the force sensor 1 is explained. The force sensor 1 may detect the force Fz in the Z-axis directions (compression force Fz1, tensile force Fz2). As below, a force detection method of the force sensor 1 will be explained. Note that, hereinafter, a state in which an external force than pressurization is not substantially applied to the force detection sensor 2 is also referred to as "natural state". Further, hereinafter, the force Fz acts on the pressure receiving surface 211 via the substrate 41 with the substrate 42 fixed.

When the compression force Fz1 is applied to the pressure receiving surface 211, the base member 21 is compressively deforms in the Z-axis direction and the pitch of the inter-digital electrode 22 (the intervals of the electrode fingers) becomes shorter than that in the natural state. Accordingly, the frequency f of the surface acoustic wave excited in the force detection sensor 2 (the resonance frequency of the SAW resonator) becomes higher than that in the natural state.

When the tensile force Fz2 is applied to the pressure receiving surface 211, the base member 21 tensilely deforms in the Z-axis direction and the pitch of the inter-digital electrode 22 becomes longer than that in the natural state. Accordingly, the frequency f of the surface acoustic wave excited in the force detection sensor 2 becomes lower than that in the natural state.

Therefore, the force sensor 1 may detect the force Fz (compression force Fz1 and tensile force Fz2) based on the changes (amounts of change and directions of change) of the frequency f from the natural state.

As above, the force sensor 1 of the embodiment is explained. The force sensor 1 has the force detection sensor 2. Accordingly, the sensor may enjoy the advantages of the above described force detection sensor 2 and exert the excellent reliability and detection property.

Second Embodiment

Figure 4:
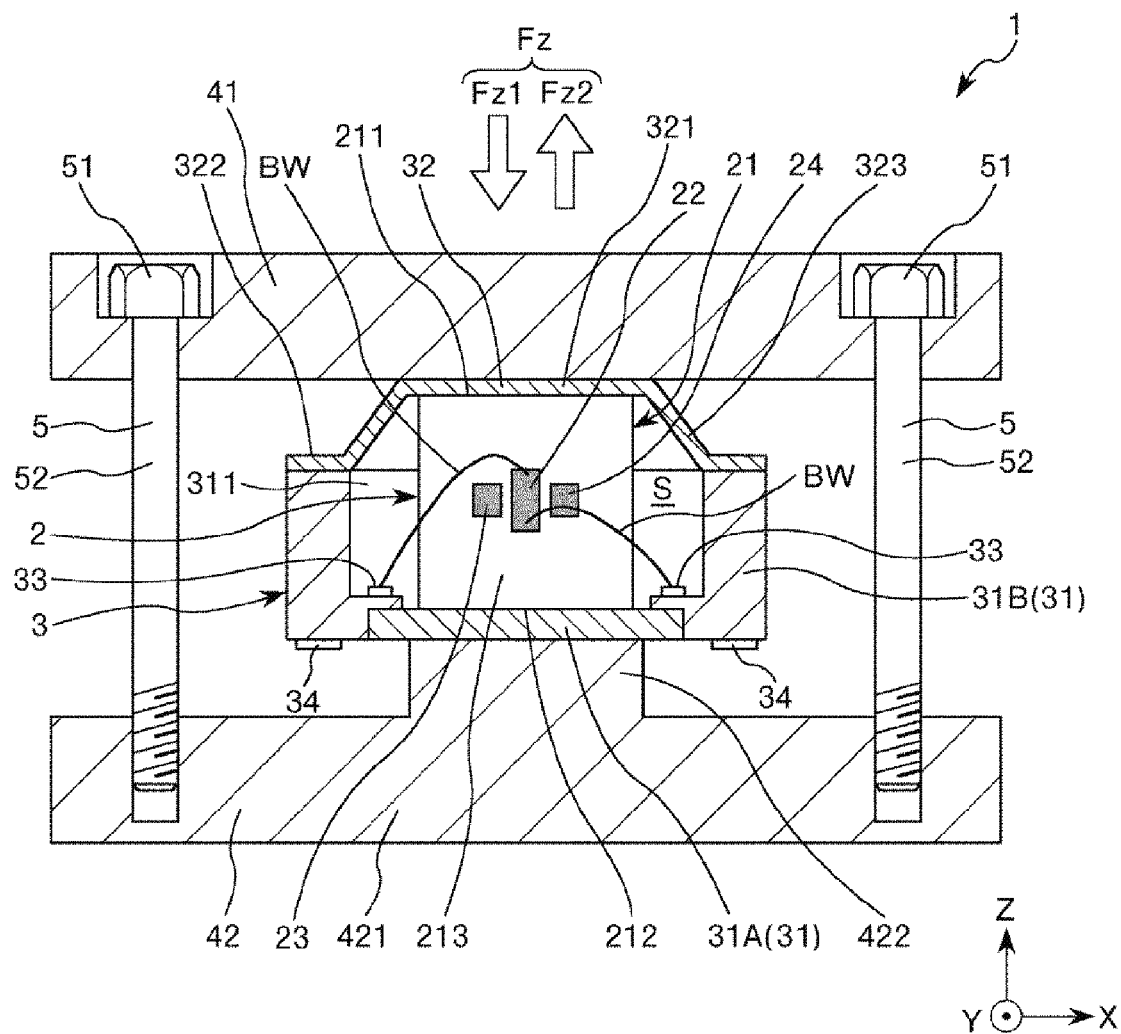
FIG. 4 is a sectional view showing a force sensor according to a second embodiment of the invention.
Figure 5:
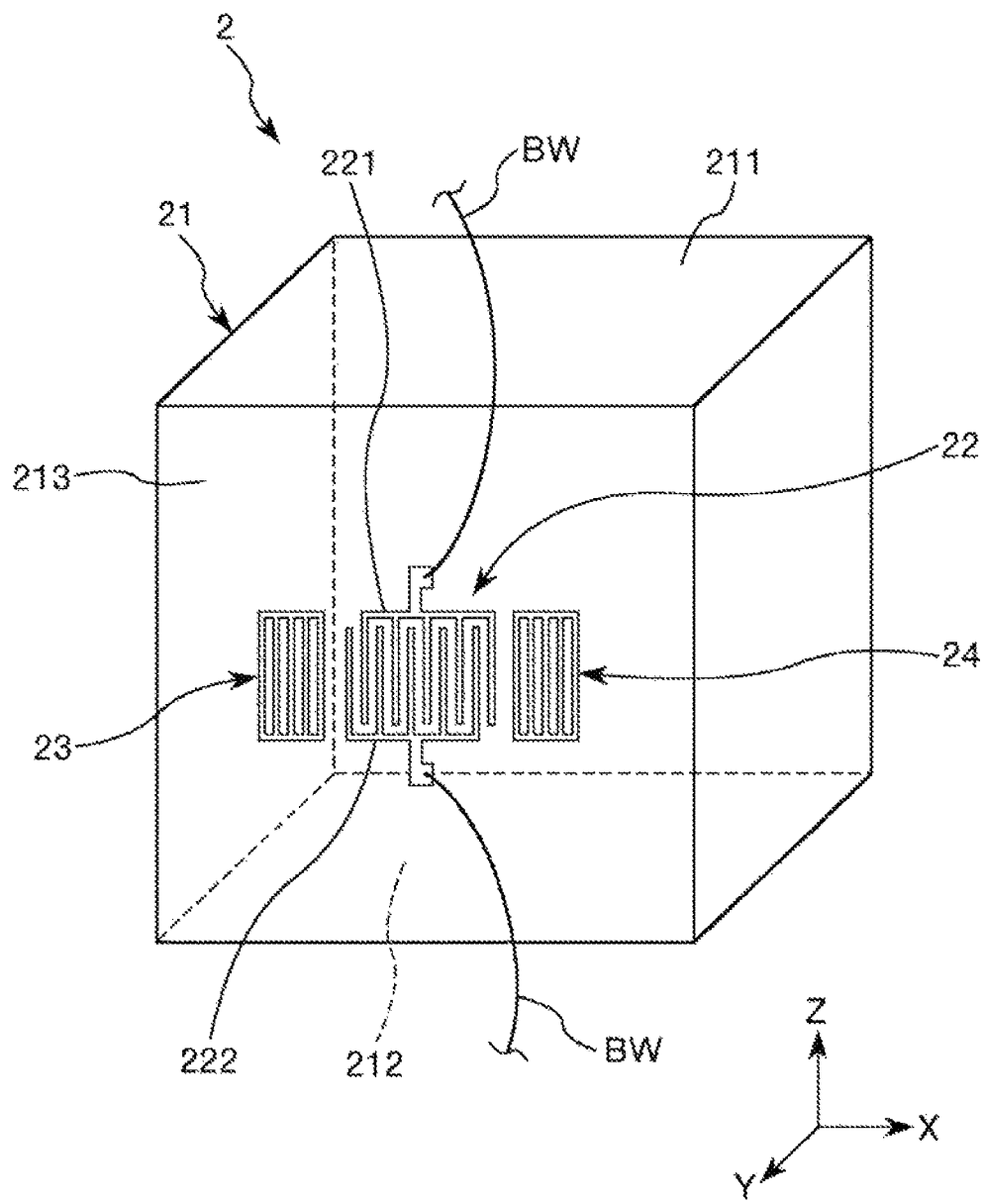
FIG. 5 is a perspective view of a force detection sensor of the force sensor shown in FIG. 4.

FIG. 4 is a sectional view showing a force sensor according to a second embodiment of the invention. FIG. 5 is a perspective view of a force detection sensor of the force sensor shown in FIG. 4.

The force sensor according to the embodiment is the same as the above described force sensor of the first embodiment mainly except that the configuration of the force detection sensor is different.

Note that, in the following explanation, the force sensor of the second embodiment will be described with a focus on the differences from the above described first embodiment and the description of the same items will be omitted. Further, in FIGS. 4 and 5, the same configurations as those of the above described first embodiment have the same signs.

As shown in FIG. 4, in the force sensor 1 of the embodiment, the force detection sensor 2 is placed in a state at 90° rotated about the Y-axis relative to that of the first embodiment. Accordingly, as shown in FIG. 5, the electrical axis of the quartz crystal forming the base member 21 extends along the X-axis direction (the direction orthogonal to the thickness direction of the force sensor 1). Further, the respective electrode fingers of both electrodes 221, 222 of the inter-digital electrode 22 are placed without contact side by side along the X-axis direction.

In the force sensor 1 having the configuration, when the compression force Fz1 is applied to the pressure receiving surface 211, the pitch of the inter-digital electrode 22 becomes longer than that in the natural state and the frequency f becomes lower than that in the natural state. When the tensile force Fz2 is applied to the pressure receiving surface 211, the pitch of the inter-digital electrode 22 becomes shorter than that in the natural state and the frequency f becomes higher than that in the natural state. Therefore, the force sensor 1 may detect the forces Fz (compression force Fz1 and tensile force Fz2) based on the changes (amounts of change and directions of change) of the frequency f from the natural state.

According to the above described second embodiment, the same advantages as those of the above described first embodiment may be exerted.

Third Embodiment

Figure 6:
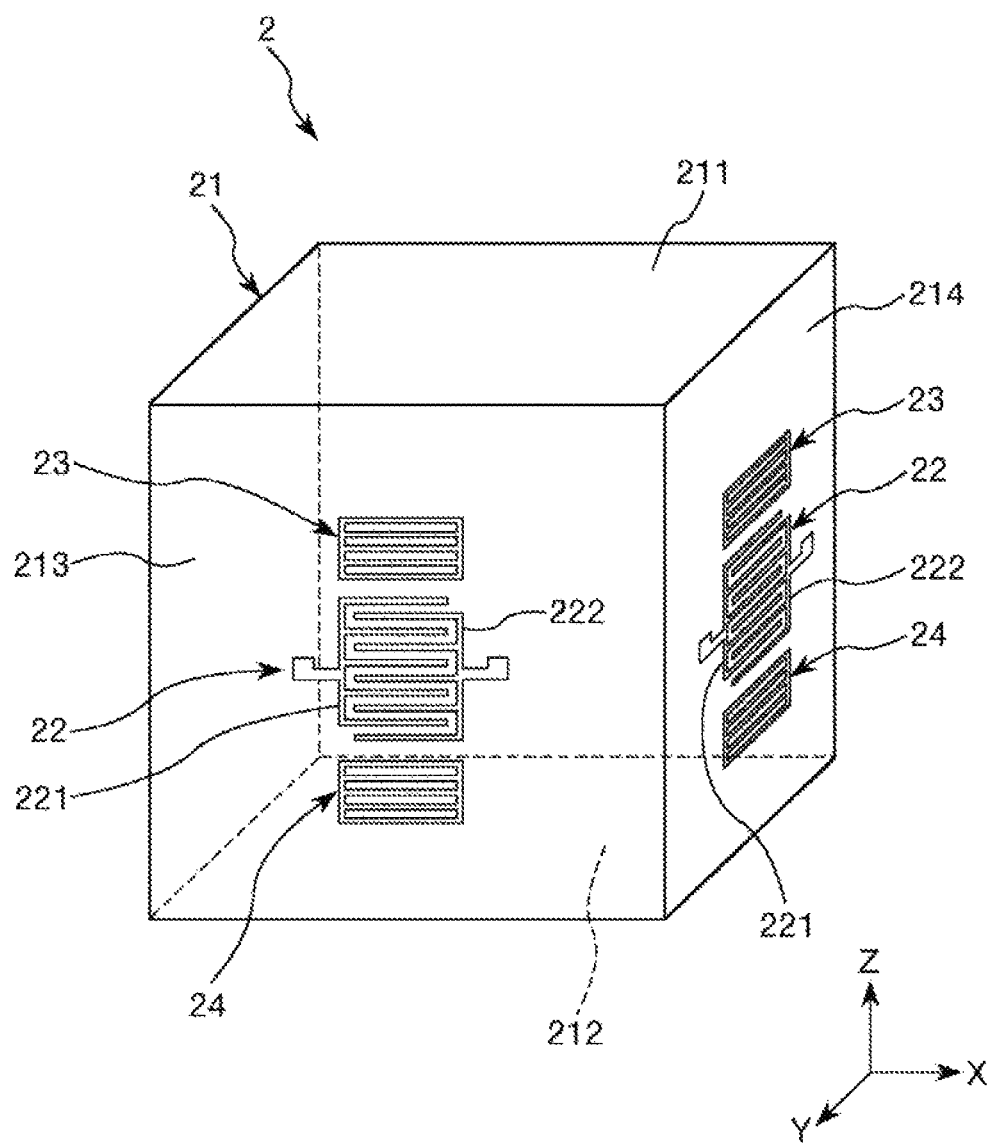
FIG. 6 is a perspective view showing a force detection sensor of a force sensor according to a third embodiment of the invention.

FIG. 6 is a perspective view showing a force detection sensor of a force sensor according to a third embodiment of the invention.

The force sensor according to the embodiment is the same as the above described force sensor of the first embodiment mainly except that the configuration of the force detection sensor is different.

Note that, in the following explanation, the force sensor of the third embodiment will be described with a focus on the differences from the above described first embodiment and the description of the same items will be omitted. Further, in FIG. 6, the same configurations as those of the above described first embodiment have the same signs. Furthermore, in FIG. 6, the bonding wires BW connected to the respective electrodes 221, 222 are not shown.

As shown in FIG. 6, in the force detection sensor 2 of the embodiment, two side surfaces of the base member 21 are used as placement surfaces 213, 214, and the inter-digital electrode 22 and the reflectors 23, 24 are placed in each of the placement surfaces 213, 214. As described above, the two placement surfaces 213, 214 are provided, and thereby, a frequency change of surface acoustic wave excited by the inter-digital electrode 22 provided on the placement surface 213 and a frequency change of surface acoustic wave excited by the inter-digital electrode 22 provided on the placement surface 214 may be detected. Accordingly, for example, the force Fz may be detected based on an average value of the detected two frequency changes. Further, for example, when the two frequency changes largely differ, a failure of the force detection sensor 2 may be determined. Thereby, the force sensor 1 with higher reliability is obtained.

Note that the number of placement surfaces on which the inter-digital electrode 22 and the reflectors 23, 24 are placed is not particularly limited, but may be three or more. Further, in the embodiment, one set of the inter-digital electrode 22 and the reflectors 23, 24 is placed on one placement surface, however, two or more sets of the inter-digital electrode 22 and the reflectors 23, 24 may be placed on one placement surface. At least one inter-digital electrode 22 of them may be placed as shown in FIG. 5.

According to the above described third embodiment, the same advantages as those of the above described first embodiment may be exerted.

Fourth Embodiment

Figure 7:
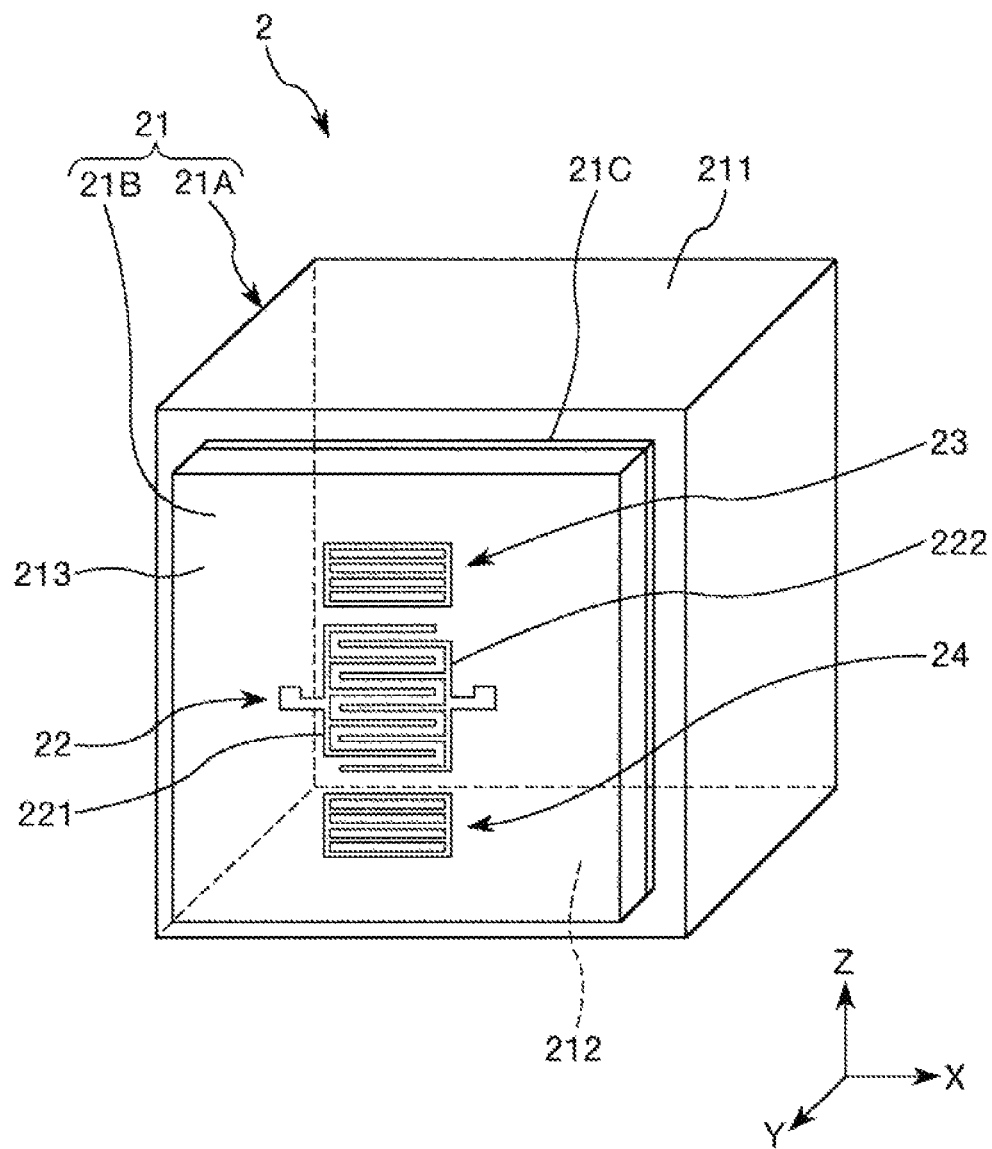
FIG. 7 is a perspective view showing a force detection sensor of a force sensor according to a fourth embodiment of the invention.

FIG. 7 is a perspective view showing a force detection sensor of a force sensor according to a fourth embodiment of the invention.

The force sensor according to the embodiment is the same as the above described force sensor of the first embodiment mainly except that the configuration of the force detection sensor is different.

Note that, in the following explanation, the force sensor of the fourth embodiment will be described with a focus on the differences from the above described first embodiment and the description of the same items will be omitted. Further, in FIG. 7, the same configurations as those of the above described first embodiment have the same signs.

As shown in FIG. 7, in the force detection sensor 2 of the embodiment, the base member 21 has a first base member 21A and a second base member 21B connected to the first base member 21A. Further, the first base member 21A has the pressure receiving surface 211 as the first surface and the second base member 21B has the placement surface 213 as the second surface. That is, the base member 21 has the first base member 21A sandwiched by the substrates 41, 42 and receives pressure and the force Fz and the second base member 21B with the inter-digital electrode 22 and the reflectors 23, 24 placed thereon as a part that functions as a SAW resonator, and the members are separately formed. As described above, the base member 21 is formed by the first base member 21A and the second base member 21B, and accordingly, shapes and constituent materials of the first base member 21A and the second base member 21B may be respectively appropriately selected. Thereby, the degree of freedom of design of the base member 21 is higher.

The constituent material of the first base member 21A is not particularly limited, but preferably a relatively hard material. The material includes e.g. various metals including iron, nickel, cobalt, gold, platinum, silver, copper, manganese, aluminum, magnesium, zinc, lead, tin, titanium, tungsten, alloys or intermetallic compounds containing at least one kind of the metals, or oxides, nitrides, carbides, etc. of the metals. On the other hand, the constituent material of the second base member 21B is not particularly limited as long as the material may excite surface acoustic wave, but various piezoelectric materials cited in the above described first embodiment may be used. Particularly, in the embodiment, the second base member 21B is formed using quartz crystal.

In the embodiment, the first base member 21A and the second base member 21B are connected (joined) via an adhesive 21C. The connecting method of the first base member 21A and the second base member 21B is not particularly limited as long as the force applied to the first base member 21A may be transmitted to the second base member 21B, but may be e.g. concavo-concave fitting, screwing using screws, welding, fusion, soldering, or the like.

According to the above described fourth embodiment, the same advantages as those of the above described first embodiment may be exerted.

Fifth Embodiment

Figure 8:
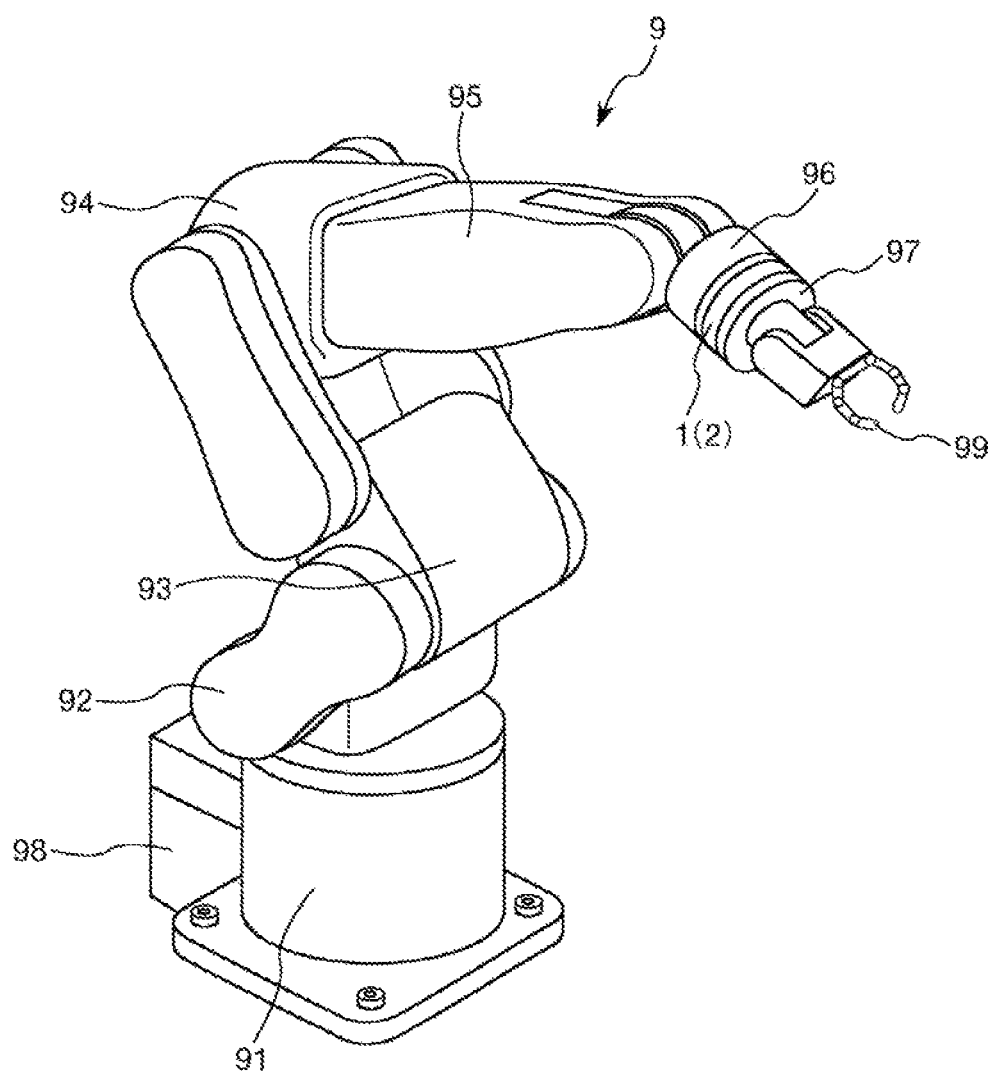
FIG. 8 is a perspective view showing a robot according to a fifth embodiment of the invention.

FIG. 8 is a perspective view showing a robot according to a fifth embodiment of the invention.

A robot 9 shown in FIG. 8 is a robot that may be used in e.g. a manufacturing process that manufactures industrial products such as precision apparatuses. As shown in the drawing, the robot 9 has a base 91 fixed to e.g. a floor or ceiling, an arm 92 rotatably coupled to the base 91, an arm 93 rotatably coupled to the arm 92, an arm 94 rotatably coupled to the arm 93, an arm 95 rotatably coupled to the arm 94, an arm 96 rotatably coupled to the arm 95, an arm 97 rotatably coupled to the arm 96, and a robot control unit 98 that controls driving of these arms 92, 93, 94, 95, 96, 97 and an end effector 99. Further, a hand connection part is provided in the arm 97 and the end effector 99 according to work to be executed by the robot 9 is attached to the hand connection part.

In the robot 9, as a sensor that detects an external force applied to the end effector 99, the above described force sensor 1 including the force detection sensor 2 is provided. The force detected by the force sensor 1 is fed back to the robot control unit 98, and thereby, the robot 9 may execute more precise work. Further, the robot 9 may sense contact of the end effector 99 with an object for work or an obstacle or the like by the force detected by the force sensor 1. Accordingly, the operation of grasping and moving the object for work by the end effector 99 or the like may be performed more properly, obstacle avoidance operation, object damage avoidance operation, etc. that have been difficult in the position control of related art may be easily performed, and the robot 9 may execute work more properly and safely.

As described above, the robot 9 has the force sensor 1 (force detection sensor 2). Accordingly, the robot may enjoy the above described force sensor 1 (force detection sensor 2) and exert excellent reliability.

According to the above described fifth embodiment, the same advantages as those of the above described first embodiment maybe exerted. Note that the configuration of the robot is not particularly limited, but the number of arms may be different from that of the embodiment. Or, the robot may be the so-called scalar robot or dual-arm robot. The installation location of the force sensor 1 in the robot 9 is not particularly limited.

As above, the force detection sensor, the force sensor, and the robot according to the invention are explained with reference to the illustrated embodiments, however, the invention is not limited to those. The configurations of the respective parts may be replaced by arbitrary configurations having the same functions. Or, other arbitrary configurations maybe added to the invention. Or, the respective embodiments may be combined as appropriate.

Further, in the above described embodiments, the force detection sensor has the force detection sensor element, package, pair of substrates, and pressurization bolts, however, the configuration of the force detection sensor is not particularly limited as long as the sensor has the force detection sensor element. For example, the package may be omitted and the force detection sensor element maybe directly sandwiched by the pair of substrates. Or, the pair of substrates and the pressurization bolts may be omitted. That is, the force detection sensor element is not necessarily pressurized.

The entire disclosure of Japanese Patent Application No. 2016-211178, filed Oct. 28, 2016 is expressly incorporated by reference herein.

What is claimed is:

1. A force detection sensor comprising:
a package that is configured with a lid, a foundation, and a frame, the force detection sensor being housed in an inner space of the package;
a quadrangular prism monolithic piezoelectric member having first, second, and third surfaces, the first and second surfaces extending in different directions, the first and third surface extending in a same direction and facing to each other, the second surface being configured to deform when the first surface receives an external force; and
an inter-digital electrode disposed entirely on the second surface,
wherein the lid is disposed on the first surface, and the foundation is disposed on the third surface,
wherein the inter-digital electrode is configured with a plurality of first finger electrodes connected to each other and a plurality of second finger electrodes connected to each other, each of the plurality of first finger electrodes extends along a first direction on the second surface, and each of the plurality of second finger electrodes extends along the first direction on the second surface, and
the plurality of first finger electrodes and the plurality of second finger electrodes are interdigitally arranged in a second direction perpendicular to the first direction on the second surface.

2. The force detection sensor according to claim 1, wherein a constituent material of the quadrangular prism monolithic piezoelectric member is quartz crystal.

3. The force detection sensor according to claim 2, wherein the first surface crosses an electrical axis of the quartz crystal.

4. A robot comprising:
a robot base;
an arm disposed on the robot base;
an end effector disposed at a tip of the arm; and
the force detection sensor according to claim 3,
wherein the force detection sensor is disposed directly adjacent to the end effector.

5. A robot comprising:
a robot base;
an arm disposed on the robot base;
an end effector disposed at a tip of the arm; and
the force detection sensor according to claim 2,
wherein the force detection sensor is disposed directly adjacent to the end effector.

6. The force detection sensor according to claim 1, wherein the quadrangular prism monolithic piezoelectric member is pressurized.

7. A robot comprising:
a robot base;
an arm disposed on the robot base;
an end effector disposed at a tip of the arm; and
the force detection sensor according to claim 6,
wherein the force detection sensor is disposed directly adjacent to the end effector.

8. A robot comprising:
a robot base;
an arm disposed on the robot base;
an end effector disposed at a tip of the arm; and
the force detection sensor according to claim 1,
wherein the force detection sensor is disposed directly adjacent to the end effector.

9. A force detection sensor comprising:
a quadrangular prism monolithic member including metal, the quadrangular prism monolithic member having a first surface, the first surface receiving an external force;
a quadrangular prism monolithic piezoelectric member having a second surface, the first and second surfaces extending in different directions, the quadrangular prism monolithic piezoelectric member being directly disposed on a third surface of the quadrangular prism monolithic member, the first and third surfaces extending in different directions, the second and third surfaces extending along the same direction, the second surface being configured to deform when the first surface receives the external force; and an inter-digital electrode disposed entirely on the second surface, wherein the inter-digital electrode is configured with a plurality of first finger electrodes connected to each other and a plurality of second finger electrodes connected to each other, each of the plurality of fist finger electrode extends along a first direction on the second surface, and each of the plurality of second finger electrodes extends along the first direction on the second surface, and the plurality of the first finger electrodes and the plurality of second finger electrodes are interdigitally arranged in a second perpendicular to the first direction on the second surface.

10. A robot comprising:
a robot base;
an arm disposed on the robot base;
an end effector disposed at a tip of the arm; and
the force detection sensor according to claim 9,
wherein the force detection sensor is disposed directly adjacent to the end effector.

* * * * *